(12) United States Patent
D'Evelyn et al.

(10) Patent No.: US 8,354,679 B1
(45) Date of Patent: Jan. 15, 2013

(54) MICROCAVITY LIGHT EMITTING DIODE METHOD OF MANUFACTURE

(75) Inventors: Mark P. D'Evelyn, Goleta, CA (US); Rajat Sharma, Goleta, CA (US)

(73) Assignee: SORAA, Inc., Fremont, CA (US)

( * ) Notice: Subject to any disclaimer, the term of this patent is extended or adjusted under 35 U.S.C. 154(b) by 390 days.

(21) Appl. No.: 12/569,337

(22) Filed: Sep. 29, 2009

Related U.S. Application Data

(60) Provisional application No. 61/102,345, filed on Oct. 2, 2008.

(51) Int. Cl.
| | |
|---|---|
| H01L 27/15 | (2006.01) |
| H01L 29/26 | (2006.01) |
| H01L 31/12 | (2006.01) |
| H01L 33/00 | (2010.01) |

(52) U.S. Cl. .......................................... 257/79; 438/46
(58) Field of Classification Search .................. None
See application file for complete search history.

(56) References Cited

U.S. PATENT DOCUMENTS

| | | | |
|---|---|---|---|
| 3,245,760 A | 4/1966 | Sawyer | |
| 3,303,053 A | 2/1967 | Strong et al. | |
| 3,335,084 A | 8/1967 | Hall | |
| 4,030,966 A | 6/1977 | Hornig et al. | |
| 4,430,051 A | 2/1984 | Von Platen | |
| 5,868,837 A | 2/1999 | DiSalvo et al. | |
| 6,090,202 A | 7/2000 | Klipov | |
| 6,129,900 A | 10/2000 | Satoh et al. | |
| 6,152,977 A | 11/2000 | D'Evelyn | |
| 6,350,191 B1 | 2/2002 | D'Evelyn et al. | |
| 6,372,002 B1 | 4/2002 | D'Evelyn et al. | |
| 6,398,867 B1 | 6/2002 | D'Evelyn et al. | |
| 6,406,776 B1 | 6/2002 | D'Evelyn | |
| 6,455,877 B1 | 9/2002 | Ogawa et al. | |
| 6,475,254 B1 | 11/2002 | Saak et al. | |
| 6,533,874 B1 | 3/2003 | Vaudo et al. | |
| 6,541,115 B2 | 4/2003 | Pender et al. | |
| 6,596,040 B2 | 7/2003 | Saak et al. | |
| 6,596,079 B1 | 7/2003 | Vaudo et al. | |
| 6,639,925 B2 | 10/2003 | Niwa et al. | |
| 6,656,615 B2 | 12/2003 | Dwilinski et al. | |
| 6,764,297 B2 | 7/2004 | Godwin et al. | |

(Continued)

FOREIGN PATENT DOCUMENTS

JP 2005-289797 A2 10/2005
(Continued)

OTHER PUBLICATIONS

Pattison et al, Gallium nitride based microcavity light emitting diodes with 2λ effective cavity thickness, Appl. Phys. Lett. 90, 031111, 2007.*

(Continued)

*Primary Examiner* — Evan Pert
*Assistant Examiner* — Andres Munoz
(74) *Attorney, Agent, or Firm* — Kilpatrick Townsend & Stockton LLP

(57) ABSTRACT

A high efficiency microcavity light emitting diode comprises a stack of $Al_xIn_yGa_{1-x-y}N$ layers, where $0 \leq x, y, x+y \leq 1$, with each layer having a high crystalline quality. The stack has a uniform thickness less than $6\lambda/n$, with an active layer centered approximately $(2i+1)\lambda/(4n)$ from a reflective electrical contact, where $\lambda$ is the peak emission wavelength, $n$ is the index of refraction at the peak emission wavelength, $i$ is an integer, and each layer within the stack has a dislocation density below about $10^5$ cm$^{-2}$.

26 Claims, 6 Drawing Sheets

U.S. PATENT DOCUMENTS

| | | | |
|---|---|---|---|
| 6,765,240 B2 | 7/2004 | Tischler et al. | |
| 6,784,463 B2 * | 8/2004 | Camras et al. | 257/99 |
| 6,806,508 B2 | 10/2004 | D'Evelyn et al. | |
| 6,858,882 B2 | 2/2005 | Tsuda et al. | |
| 6,861,130 B2 | 3/2005 | D'Evelyn et al. | |
| 6,936,488 B2 | 8/2005 | D'Evelyn et al. | |
| 6,955,719 B2 | 10/2005 | Dmitriev et al. | |
| 7,001,577 B2 | 2/2006 | Zimmerman et al. | |
| 7,009,199 B2 | 3/2006 | Hall et al. | |
| 7,009,215 B2 | 3/2006 | D'Evelyn et al. | |
| 7,026,755 B2 | 4/2006 | Setlur et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn et al. | |
| 7,067,407 B2 | 6/2006 | Kostamo et al. | |
| 7,078,731 B2 | 7/2006 | D'Evelyn et al. | |
| 7,098,487 B2 | 8/2006 | D'Evelyn et al. | |
| 7,101,433 B2 | 9/2006 | D'Evelyn et al. | |
| 7,102,158 B2 | 9/2006 | Tysoe et al. | |
| 7,105,865 B2 | 9/2006 | Nakahata et al. | |
| 7,112,829 B2 * | 9/2006 | Picard et al. | 257/188 |
| 7,119,372 B2 | 10/2006 | Stokes et al. | |
| 7,122,827 B2 | 10/2006 | Alizadeh et al. | |
| 7,125,453 B2 | 10/2006 | D'Evelyn et al. | |
| 7,160,388 B2 | 1/2007 | Dwilinski et al. | |
| 7,160,531 B1 | 1/2007 | Jacques et al. | |
| 7,175,704 B2 | 2/2007 | D'Evelyn et al. | |
| 7,198,671 B2 | 4/2007 | Ueda | |
| 7,208,393 B2 | 4/2007 | Haskell et al. | |
| 7,220,658 B2 | 5/2007 | Haskell et al. | |
| 7,252,712 B2 | 8/2007 | Dwilinski et al. | |
| 7,285,801 B2 | 10/2007 | Eliashevich et al. | |
| 7,291,544 B2 | 11/2007 | D'Evelyn et al. | |
| 7,316,746 B2 | 1/2008 | D'Evelyn et al. | |
| 7,329,371 B2 | 2/2008 | Setlur et al. | |
| 7,335,262 B2 | 2/2008 | Dwilinski et al. | |
| 7,338,828 B2 | 3/2008 | Imer et al. | |
| 7,358,542 B2 | 4/2008 | Radkov et al. | |
| 7,364,619 B2 | 4/2008 | Dwilinski et al. | |
| 7,368,015 B2 | 5/2008 | D'Evelyn et al. | |
| 7,381,391 B2 | 6/2008 | Spencer et al. | |
| 7,420,261 B2 | 9/2008 | Dwilinski et al. | |
| 7,572,425 B2 | 8/2009 | McNulty et al. | |
| 7,625,446 B2 | 12/2009 | D'Evelyn et al. | |
| 7,642,122 B2 | 1/2010 | Tysoe et al. | |
| 7,704,324 B2 | 4/2010 | D'Evelyn et al. | |
| 7,705,276 B2 | 4/2010 | Giddings et al. | |
| 7,871,839 B2 | 1/2011 | Lee et al. | |
| 7,976,630 B2 | 7/2011 | Poblenz et al. | |
| 8,021,481 B2 | 9/2011 | D'Evelyn | |
| 8,048,225 B2 | 11/2011 | Poblenz et al. | |
| 8,097,081 B2 | 1/2012 | D'Evelyn | |
| 8,148,801 B2 | 4/2012 | D'Evelyn | |
| 8,188,504 B2 | 5/2012 | Lee | |
| 8,198,643 B2 | 6/2012 | Lee et al. | |
| 8,207,548 B2 | 6/2012 | Nagai | |
| 2001/0009134 A1 | 7/2001 | Kim et al. | |
| 2001/0011935 A1 | 8/2001 | Lee et al. | |
| 2001/0048114 A1 | 12/2001 | Morita et al. | |
| 2002/0070416 A1 | 6/2002 | Morse et al. | |
| 2002/0105986 A1 | 8/2002 | Yamasaki | |
| 2002/0182768 A1 | 12/2002 | Morse et al. | |
| 2002/0189532 A1 | 12/2002 | Motoki et al. | |
| 2003/0027014 A1 | 2/2003 | Johnson et al. | |
| 2003/0140845 A1 | 7/2003 | D'Evelyn et al. | |
| 2003/0145784 A1 | 8/2003 | Thompson et al. | |
| 2003/0164507 A1 | 9/2003 | Edmond et al. | |
| 2003/0183155 A1 | 10/2003 | D'Evelyn et al. | |
| 2003/0209191 A1 | 11/2003 | Purdy | |
| 2003/0232512 A1 | 12/2003 | Dickinson et al. | |
| 2004/0000266 A1 | 1/2004 | D'Evelyn et al. | |
| 2004/0104391 A1 | 6/2004 | Maeda et al. | |
| 2004/0124435 A1 | 7/2004 | D'Evelyn et al. | |
| 2004/0161222 A1 | 8/2004 | Niida et al. | |
| 2004/0222357 A1 | 11/2004 | King et al. | |
| 2005/0087753 A1 | 4/2005 | D'Evelyn et al. | |
| 2005/0098095 A1 | 5/2005 | D'Evelyn et al. | |
| 2005/0109240 A1 | 5/2005 | Maeta et al. | |
| 2005/0121679 A1 | 6/2005 | Nagahama et al. | |
| 2005/0128459 A1 | 6/2005 | Zwet et al. | |
| 2005/0128469 A1 | 6/2005 | Hall et al. | |
| 2005/0152820 A1 | 7/2005 | D'Evelyn et al. | |
| 2005/0167680 A1 | 8/2005 | Shei et al. | |
| 2005/0191773 A1 | 9/2005 | Suzuki et al. | |
| 2005/0205215 A1 | 9/2005 | Giddings et al. | |
| 2005/0263791 A1 | 12/2005 | Yanagihara et al. | |
| 2006/0030738 A1 | 2/2006 | Vanmaele et al. | |
| 2006/0032428 A1 | 2/2006 | Dwilinski et al. | |
| 2006/0037529 A1 | 2/2006 | D'Evelyn et al. | |
| 2006/0037530 A1 | 2/2006 | Dwilinski et al. | |
| 2006/0038193 A1 | 2/2006 | Wu et al. | |
| 2006/0048699 A1 | 3/2006 | D'Evelyn et al. | |
| 2006/0096521 A1 | 5/2006 | D'Evelyn et al. | |
| 2006/0118799 A1 | 6/2006 | D'Evelyn et al. | |
| 2006/0163589 A1 | 7/2006 | Fan et al. | |
| 2006/0169993 A1 | 8/2006 | Fan et al. | |
| 2006/0177362 A1 | 8/2006 | D'Evelyn et al. | |
| 2006/0207497 A1 | 9/2006 | D'Evelyn et al. | |
| 2006/0213429 A1 | 9/2006 | Motoki et al. | |
| 2006/0214287 A1 | 9/2006 | Ogihara et al. | |
| 2006/0228870 A1 | 10/2006 | Oshima | |
| 2006/0246687 A1 | 11/2006 | Kaiser et al. | |
| 2006/0255343 A1 | 11/2006 | Ogihara et al. | |
| 2006/0289386 A1 | 12/2006 | Tysoe et al. | |
| 2007/0015345 A1 | 1/2007 | Baker et al. | |
| 2007/0057337 A1 | 3/2007 | Kano et al. | |
| 2007/0077674 A1 | 4/2007 | Okuyama et al. | |
| 2007/0096239 A1 | 5/2007 | Cao et al. | |
| 2007/0105351 A1 | 5/2007 | Motoki et al. | |
| 2007/0114569 A1 | 5/2007 | Wu et al. | |
| 2007/0131967 A1 | 6/2007 | Kawaguchi et al. | |
| 2007/0141819 A1 | 6/2007 | Park | |
| 2007/0142204 A1 | 6/2007 | Park et al. | |
| 2007/0151509 A1 | 7/2007 | Park | |
| 2007/0158785 A1 | 7/2007 | D'Evelyn et al. | |
| 2007/0164292 A1 | 7/2007 | Okuyama | |
| 2007/0166853 A1 | 7/2007 | Guenther et al. | |
| 2007/0178039 A1 | 8/2007 | D'Evelyn et al. | |
| 2007/0181056 A1 | 8/2007 | D'Evelyn et al. | |
| 2007/0190758 A1 | 8/2007 | Kaeding et al. | |
| 2007/0197004 A1 | 8/2007 | Dadgar et al. | |
| 2007/0210074 A1 | 9/2007 | Maurer et al. | |
| 2007/0215033 A1 | 9/2007 | Imaeda et al. | |
| 2007/0228404 A1 | 10/2007 | Tran et al. | |
| 2007/0234946 A1 | 10/2007 | Hashimoto et al. | |
| 2007/0252164 A1 | 11/2007 | Zhong et al. | |
| 2007/0274359 A1 | 11/2007 | Takeuchi et al. | |
| 2007/0290224 A1 | 12/2007 | Ogawa | |
| 2008/0006831 A1 * | 1/2008 | Ng | 257/79 |
| 2008/0008855 A1 | 1/2008 | D'Evelyn et al. | |
| 2008/0023691 A1 | 1/2008 | Jang et al. | |
| 2008/0073660 A1 | 3/2008 | Ohno et al. | |
| 2008/0083741 A1 | 4/2008 | Giddings et al. | |
| 2008/0083929 A1 | 4/2008 | Fan et al. | |
| 2008/0087919 A1 | 4/2008 | Tysoe et al. | |
| 2008/0106212 A1 | 5/2008 | Yen et al. | |
| 2008/0121906 A1 | 5/2008 | Yakushiji | |
| 2008/0128752 A1 | 6/2008 | Wu | |
| 2008/0156254 A1 | 7/2008 | Dwilinski et al. | |
| 2008/0193363 A1 | 8/2008 | Tsuji | |
| 2008/0198881 A1 | 8/2008 | Farrell et al. | |
| 2008/0211416 A1 | 9/2008 | Negley et al. | |
| 2008/0230765 A1 | 9/2008 | Yoon et al. | |
| 2008/0272462 A1 | 11/2008 | Shimamoto | |
| 2008/0282978 A1 | 11/2008 | Butcher et al. | |
| 2008/0285609 A1 | 11/2008 | Ohta et al. | |
| 2008/0298409 A1 | 12/2008 | Yamashita et al. | |
| 2009/0078955 A1 | 3/2009 | Fan et al. | |
| 2009/0092536 A1 | 4/2009 | Kawabata et al. | |
| 2009/0146170 A1 | 6/2009 | Zhong et al. | |
| 2009/0213593 A1 | 8/2009 | Foley et al. | |
| 2009/0218593 A1 | 9/2009 | Kamikawa et al. | |
| 2009/0250686 A1 | 10/2009 | Sato et al. | |
| 2009/0301387 A1 | 12/2009 | D'Evelyn | |
| 2009/0301388 A1 | 12/2009 | D'Evelyn | |
| 2009/0309110 A1 | 12/2009 | Raring et al. | |
| 2009/0320744 A1 | 12/2009 | D'Evelyn et al. | |

| | | | |
|---|---|---|---|
| 2009/0320745 A1 | 12/2009 | D'Evelyn et al. | |
| 2010/0001300 A1 | 1/2010 | Raring et al. | |
| 2010/0003492 A1 | 1/2010 | D'Evelyn | |
| 2010/0025656 A1 | 2/2010 | Raring et al. | |
| 2010/0031872 A1 | 2/2010 | D'Evelyn | |
| 2010/0031873 A1 | 2/2010 | D'Evelyn | |
| 2010/0031874 A1 | 2/2010 | D'Evelyn | |
| 2010/0031875 A1 | 2/2010 | D'Evelyn | |
| 2010/0031876 A1 | 2/2010 | D'Evelyn | |
| 2010/0032691 A1 | 2/2010 | Kim | |
| 2010/0108985 A1 | 5/2010 | Chung et al. | |
| 2010/0109030 A1 | 5/2010 | Krames et al. | |
| 2010/0117101 A1 | 5/2010 | Kim et al. | |
| 2010/0117118 A1 | 5/2010 | Dabiran et al. | |
| 2010/0147210 A1 | 6/2010 | D'Evelyn | |
| 2010/0151194 A1 | 6/2010 | D'Evelyn | |
| 2010/0219505 A1 | 9/2010 | D'Evelyn | |
| 2010/0295088 A1 | 11/2010 | D'Evelyn et al. | |
| 2011/0017298 A1 | 1/2011 | Lee | |
| 2011/0100291 A1 | 5/2011 | D'Evelyn | |
| 2011/0108081 A1 | 5/2011 | Werthen et al. | |
| 2011/0121331 A1 | 5/2011 | Simonian et al. | |
| 2011/0175200 A1 | 7/2011 | Yoshida | |
| 2011/0183498 A1 | 7/2011 | D'Evelyn | |
| 2011/0220912 A1 | 9/2011 | D'Evelyn | |
| 2011/0256693 A1 | 10/2011 | D'Evelyn et al. | |
| 2011/0262773 A1 | 10/2011 | Poblenz et al. | |
| 2012/0000415 A1 | 1/2012 | D'Evelyn et al. | |
| 2012/0007102 A1 | 1/2012 | Feezell et al. | |
| 2012/0073494 A1 | 3/2012 | D'Evelyn | |
| 2012/0091465 A1 | 4/2012 | Krames et al. | |
| 2012/0118223 A1 | 5/2012 | D'Evelyn | |
| 2012/0137966 A1 | 6/2012 | D'Evelyn et al. | |
| 2012/0178215 A1 | 7/2012 | D'Evelyn | |
| 2012/0187412 A1 | 7/2012 | D'Evelyn et al. | |
| 2012/0199952 A1 | 8/2012 | D'Evelyn et al. | |

FOREIGN PATENT DOCUMENTS

| | | |
|---|---|---|
| JP | 2007-039321 A | 2/2007 |
| WO | WO 2005121415 A1 | 12/2005 |
| WO | WO2007-004495 | 1/2007 |
| WO | WO2012-016033 | 2/2012 |

OTHER PUBLICATIONS

Chiang et al. "Luminescent Properties of Cerium-Activated Garnet Series Phosphor: Structure and Temperature Effects," Journal of the Electrochemical Society 155:B517-B520 (2008).

Chiu et al. "Synthesis and Luminescence Properties of Intensely Red-Emitting M5Eu $(WO_4)_{4-x}(MoO_4)_x$ (M = Li, Na, K) Phosphors," Journal of the Electrochemical Society 15:J71-J78 (2008).

Ci et al. "$Ca_{1-x}Mo_{1-y}Nb_yO_4:Eu_x^{3+}$: A novel red phosphor for white light emitting diodes," Journal of Physics 152:670-674 (2008).

Happek "Development of Efficient UV-LED Phosphor Coatings for Energy Saving Solid State Lighting" University of Georgia (Jan. 2007).

Höppe et al. "Luminescence in $Eu^{2+}$-doped $Ba_2Si_5 N_8$: fluorescence, thernoliminescence, and upconversion"; Journal of Physics and Chemistry of Solids 61:2001-2006 (2000).

Li et al. "The effect of replacement of Sr by Ca on the structural and luminescence properties of the red-emitting $Sr_2Si_5N_8$:$Eu_2$+ LED conversion phosphor," Journal of Solid State Chemistry 181:515-524 (2008).

Mueller-Mach et al. "Highly efficient all-nitride phosphor-converted white light emitting diode," Physica Status Solidi (a) 202:1727-1732 (Jul. 2005).

Setlur et al. "Crystal chemistry and luminescence of $Ce^{3+}$-doped $(Lu_2CaMg_2)$-Ca-2(Si, Ge)$_3O_{12}$ and its use in LED based lighting," Chemistry of Materials 18: 3314-3322 (2006).

Wang et al. "New red $Y_{0.85}Bi_{0.1}Eu_{0.05}V_{1-y}M_yO_4$ (M=Nb, P) phosphors for light-emitting diodes," Physica B: Condensed Matter 403:2071-2075 (Jun. 2008).

Yamamoto "White LED phosphors: the next step," Proceeding of . SPIE (2010).

Yang et al. "Preparation and luminescence properties of LED conversion novel phosphors $SrZnO_2$:Sm," Materials Letters 62:907-910 (Mar. 2008).

Byrappa et al., "Handbook of Hydrothermal Technology: A Technology for Crystal Growth and Materials Processing," Noyes Publications, Park Ridge, New Jersey, 2001, pp. 94-96 and 152.

Callahan et al., "Synthesis and Growth of Gallium Nitride by the Chemical Vapor Reaction Process (CVRP)," 1999, MRS Internet Journal Nitride Semiconductor Research, vol. 4, Issue No. 10, pp. 1-6.

D'Evelyn et al., "Bulk GaN Crystal Growth by the High-Pressure Ammonothermal Method," Journal of Crystal Growth, 2007, vol. 300, pp. 11-16.

Dwiliński et al, AMMONO Method of BN, AlN, and GaN Synthesis and Crystal Growth,: Journal of Nitride Semiconductor Research, 1998, 3,25, MRS, Internet: http://nsr.mij.mrs.org.

Dwilinski et al., "Excellent Crystallinity of Truly Bulk Ammonothermal GaN," Journal of Crystal Growth, 2008, vol. 310, pp. 3911-3916.

Ehrentraut et al., "Prospects for the Ammonothermal Growth of Large GaN Crystal," Journal of Crystal Growth, 2007, vol. 305, pp. 304-310.

Farrell et al., "Continuous-wave Operation of AlGaN-cladding-free Nonpolar m-Plane InGaN/GaN Laser Diodes," 2007, Japanese Journal of Applied Physics, vol. 46, No. 32, pp. L761-L763.

Feezell et al., "AlGaN-Cladding-Free Nonpolar InGaN/GaN Laser Diodes," Japanese Journal of Applied Physics, vol. 46, No. 13, pp. L284-L286.

Frayssinet et al., "Evidence of Free Carrier Concentration Gradient Along the c-axis for Undoped GaN Single Crystals," Journal of Crystal Growth, 2001, vol. 230, pp. 442-447.

Hashimoto et al. "Ammonothermal growth of bulk GaN," Journal of Crystal Growth 310:3907-3910 (Aug. 2008).

Hashimoto et al. "A GaN bulk crystal wit improved structural quality grown by the ammonothermal method," Nature Materials 6:568-671 (Jul. 2007).

Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.

Kim et al, "Improved Electroluminescence on Nonpolar m-plane InGaN/GaN Qantum Well LEDs", 2007, Physica Status Solidi (RRL), vol. 1, No. 3, pp. 125-127.

Kojima et al., "Stimulated Emission at 474 nm from an InGaN Laser Diode Structure Grown on a (1122) GaN Substrate ," 2007, Applied Physics Letter, vol. 91, No. 25, pp. 251107-251107-3.

Kolis et al., "Crystal Growth of Gallium Nitride in Supercritical Ammonia," Journal of Crystal Growth, 2001, vol. 222, pp. 431-434.

Kolis et al., "Materials Chemistry and Bulk Crystal Growth of Group III Nitrides in Supercritical Ammonia" Mat. Res. Soc. Symp. Proc., 1998, vol. 495, pp. 367-372.

Kubota et al., "Temperature Dependence of Polarized Photoluminescence from Nonpolar m-plane InGaN Multiple Quantum Wells for Blue Laser Diodes" 2008, Applied Physics Letter, vol. 92, pp. 011920-011920-3.

Mirwald et al., "Low-Friction Cell for Piston-Cylinder High Pressure Apparatus," Journal of Geophysical Research, 1975, vol. 80, No. 11, pp. 1519-1525.

Motoki et al. "Growth and Characterization of Freestanding GaN Substrates," Journal of Crystal Growth, 2002, vol. 237-239, pp. 912-921.

Murota et al., "Solid State Light Source Fabricated with YAG:Ce Single Crystal," 2002, Japanese Journal of Applied Physics, vol. 46, No. 41, Part 2, No. 8A, pp. L887-L888.

Okamoto et al., "Continuous-Wave Operation of m-Plane InGaN Multiple Quantum Well Laser Diodes," 2007, Japanese Journal of Applied Physics, vol. 46, No. 9, pp. L187-L189.

Okamoto et al., "Pure Blue Laser Diodes Based on Nonpolar m-Plane Gallium Nitride with InGaN Waveguiding Layers," 2007, Japanese Journal of Applied Physics, vol. 46, No. 35, pp. L820-L822.

Oshima et al., "Thermal and Optical Properties of Bulk GaN Crystals Fabricated Through Hydride Vapor Phase Epitaxy with Void-Assisted Separation," 2005, Journal of Applied Physics, vol. 98, pp. 103509-1-103509-3.

Peters, "Ammonothermal Synthesis of Aluminium Nitride," Journal of Crystal Growth, 1999, vol. 4, pp. 411-418.

Sarva, et al. "Dynamic compressive strength of silicon carbide under uniaxial compression," Mat. Sci. & Eng. A 317,140 (2001).
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-Plane InGaN/GaN Laser Diodes ," 2007, Japanese Journal of Applied Physics, vol. 46, No. 9, L190-L191.
Sizov et al., "500-nm Optical Gain Anisotropy of Semipolar (1122) InGaN Quantum Wells," 2009, Applied Physics Express, vol. 2, pp. 071001-1-071001-3.
Tsuda et al., "Blue Laser Diodes Fabricated on m-Plane GaN Substrates," 2008, Applied Physics Express, vol. 1, pp. 011104-011104-03.
Tyagi et al., "Semipolar (1011) InGaN/GaN Laser Diodes on Bulk GaN Substrates," 2007, Japanese Journal of Applied Physics, vol. 46, No. 19, pp. L444-L445.
Wang et al. "Ammonothermal growth of GaN crystals in alkaline solutions," Journal of crystal Growth 287:376-380 (Jan. 2006).
Wang et al., "Ammonothermal Synthesis of III-Nitride Crystals," Crystal Growth & Design, 2006, vol. 6, Issue No. 6, pp. 1227-1246.
Wang et al., "Synthesis of Dense Polycrystaline GaN of High Purity by the Chemical Vapor Reaction Process," Journal of Crystal Growth, 2006, vol. 286, pp. 50-54.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
Weisbuch et al., Recent results and latest views on microcavity LEDs, in Light-Emitting Diodes: Research, Manufacturing, and Applications VIII, ed. By S.A. Stockman et al., *Proc. SPIE*, vol. 5366, p. 1 (2004).
Choi et al., 2.5λ microcavity InGaN light-emitting diodes fabricated by a selective dry-etch thinning process, *Applied Physics Letters*, 2007, 91(6), 061120.
Lide et al., 'Thermal Conductivity of Ceramics and Other Insulating Materials,' CRC Handbook of Chemistry and Physics, 91st Edition, 2010-2011, pp. 12-203 and 12-204.
http://www.matbase.com/material/non-ferrous-metals/other/molybdenum/properties, Data Table For: Non-Ferrous Metals: Other Metals: Molybdenum.
USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 5, 2011.
USPTO Office Action for U.S. Appl. No. 12/334,418 dated Oct. 19, 2011.
USPTO Office Action for U.S. Appl. No. 12/478,736 dated Sep. 27, 2011.
USPTO Notice of Allowance for U.S. Appl. No. 12/478,736 dated Apr. 23, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/534,844 dated Sep. 16, 2010.
USPTO Office Action for U.S. Appl. No. 12/534,844 dated Feb. 2, 2011.
USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/634,665 dated Apr. 25, 2012.
USPTO Notice of Allowance for U.S. Appl. No. 12/754,886 dated May 17, 2012.
USPTO Notice of Allowance for U.S. Appl. No. 12/754,886 dated Jun. 5, 2012.
USPTO Notice of Allowance for U.S. Appl. No. 12/754,886 dated Jun. 20, 2012.
International Search Report of PCT Application No. PCT/US2009/48489, dated Sep. 14, 2009, 3 pages total.
Office action for U.S. Appl. No. 12/497,969 (Feb. 2, 2012).
Office action for U.S. Appl. No. 12/478,736 (Feb. 7, 2012).
Office action for U.S. Appl. No. 12/569,841 (Dec. 23, 2011).
Office action for U.S. Appl. No. 12/724,983 (Mar. 5, 2012).
Office action for U.S. Appl. No. 12/785,404 (Mar. 6, 2012).
Office action for U.S. Appl. No. 12/491,176 (Mar. 1, 2012).
Fukuda et al. "Prospects for the ammonothermal growth of large GaN crystal," Journal of Crystal Growth 305: 304-310 (Jul. 2007).
USPTO Office Action for U.S. Appl. No. 12/497,969 dated Jul. 5, 2012.
USPTO Office Action for U.S. Appl. No. 12/534,843 dated Sep. 10, 2012.
USPTO Notice of Allowance for U.S. Appl. No. 12/534,849 dated Jul. 31, 2012.
USPTO Notice of Allowance for U.S. Appl. No. 12/785,404 dated Jul. 16, 2012.
USPTO Office Action for U.S. Appl. No. 13/179,346 dated Aug. 17, 2012.
USPTO Notice of Allowance for U.S. Appl. No. 13/425,304 dated Aug. 22, 2012.

* cited by examiner

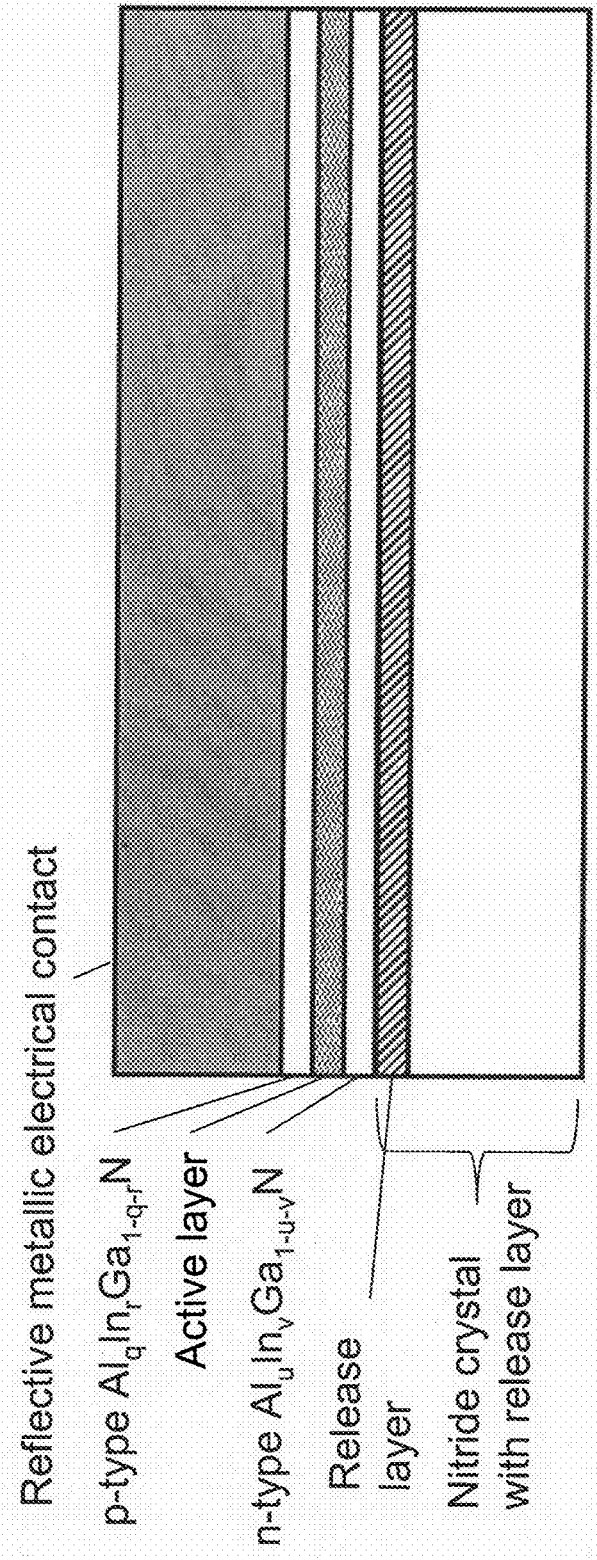

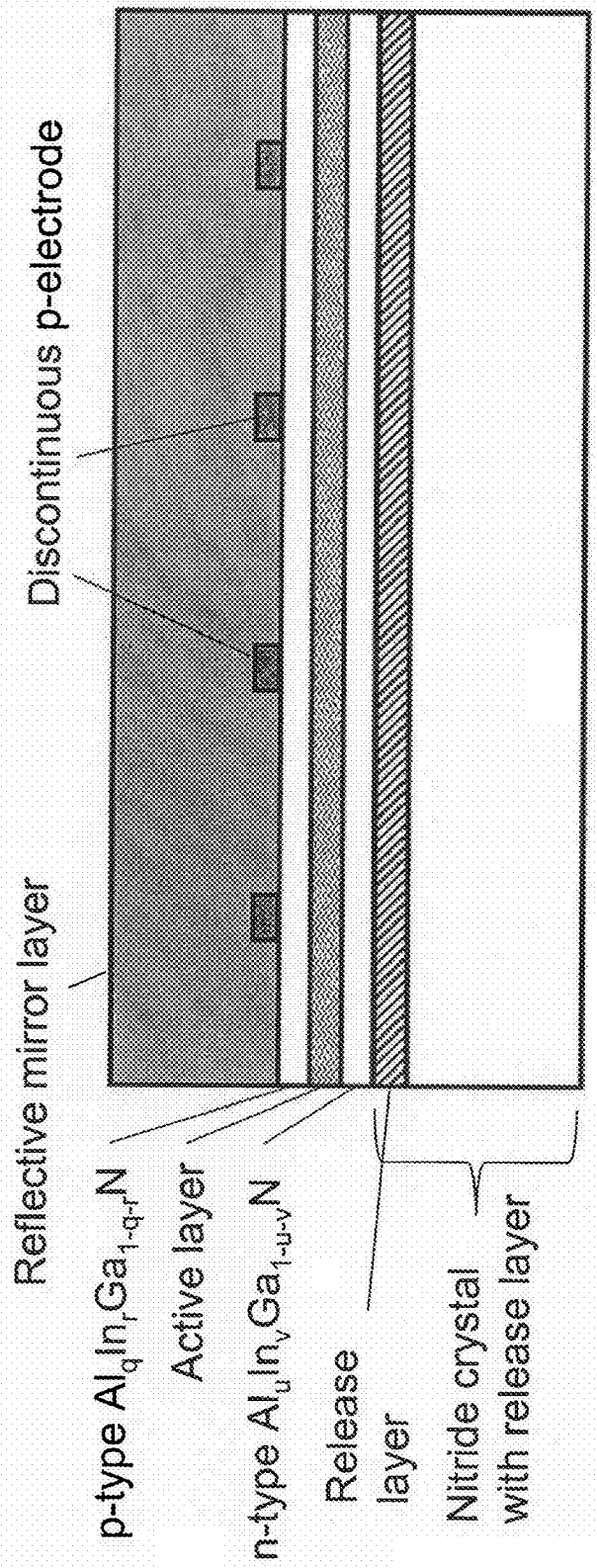

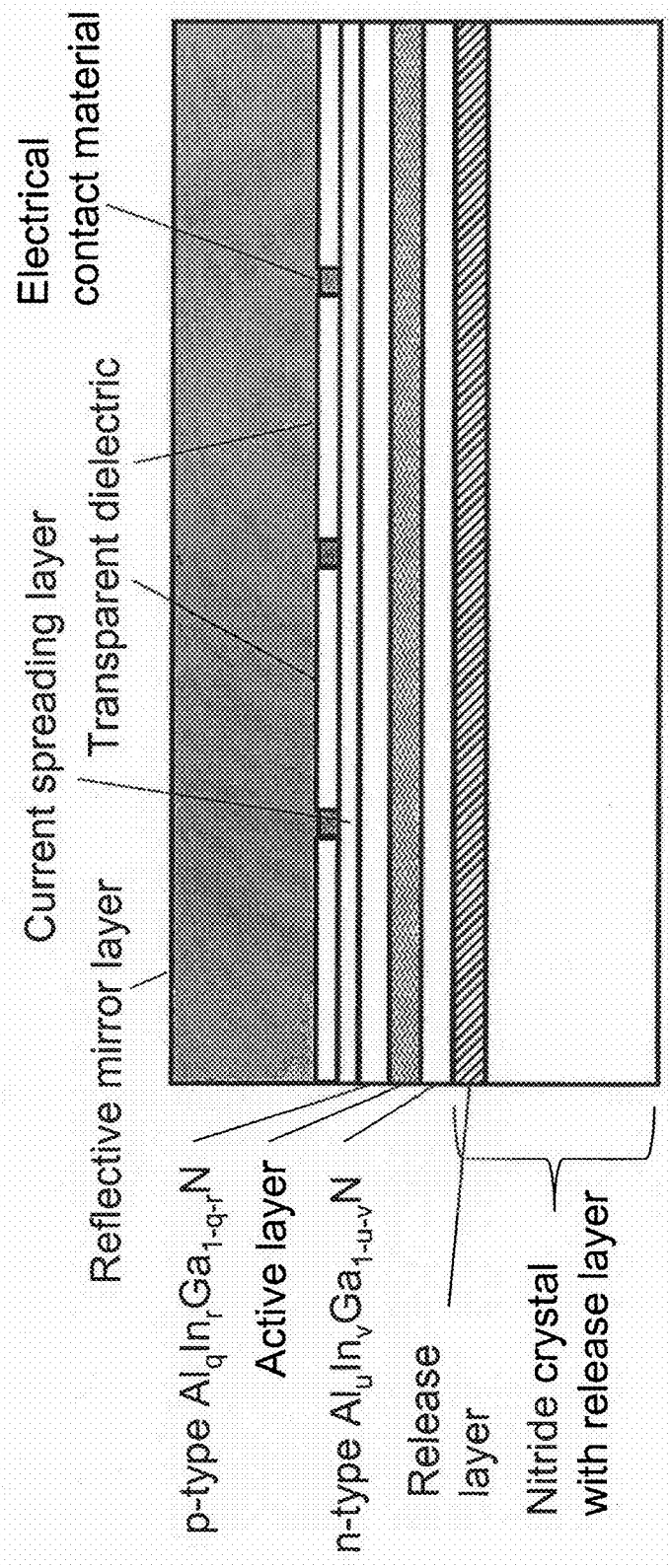

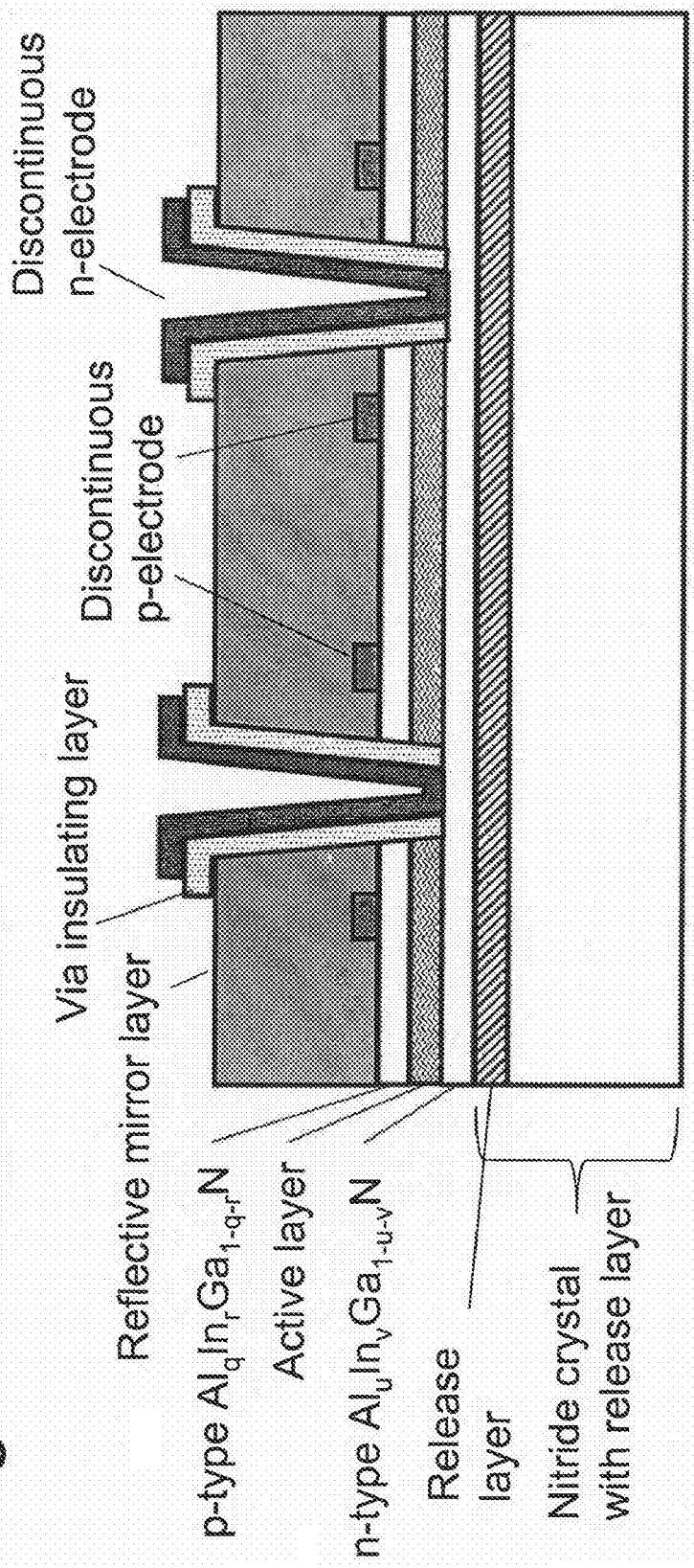

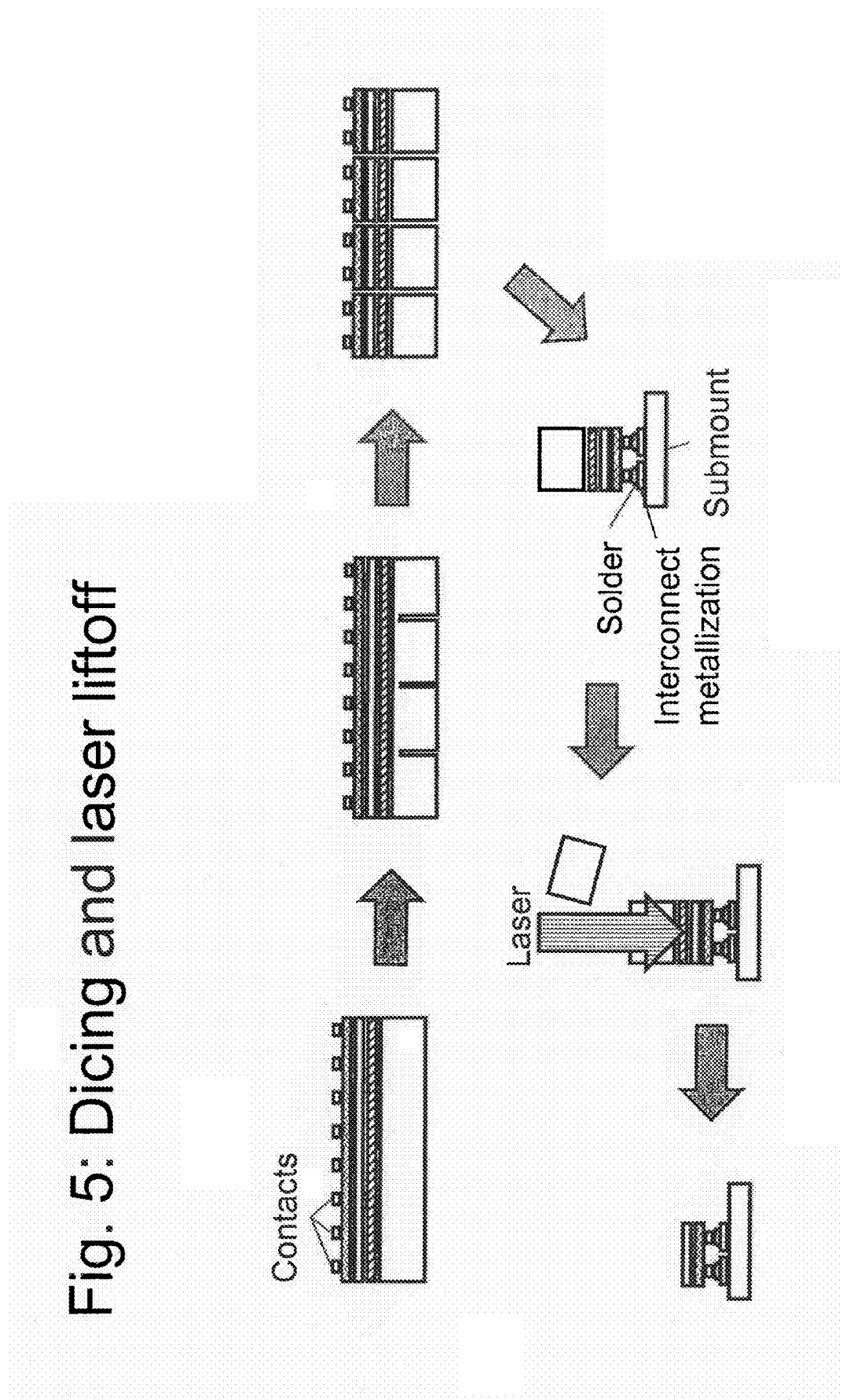

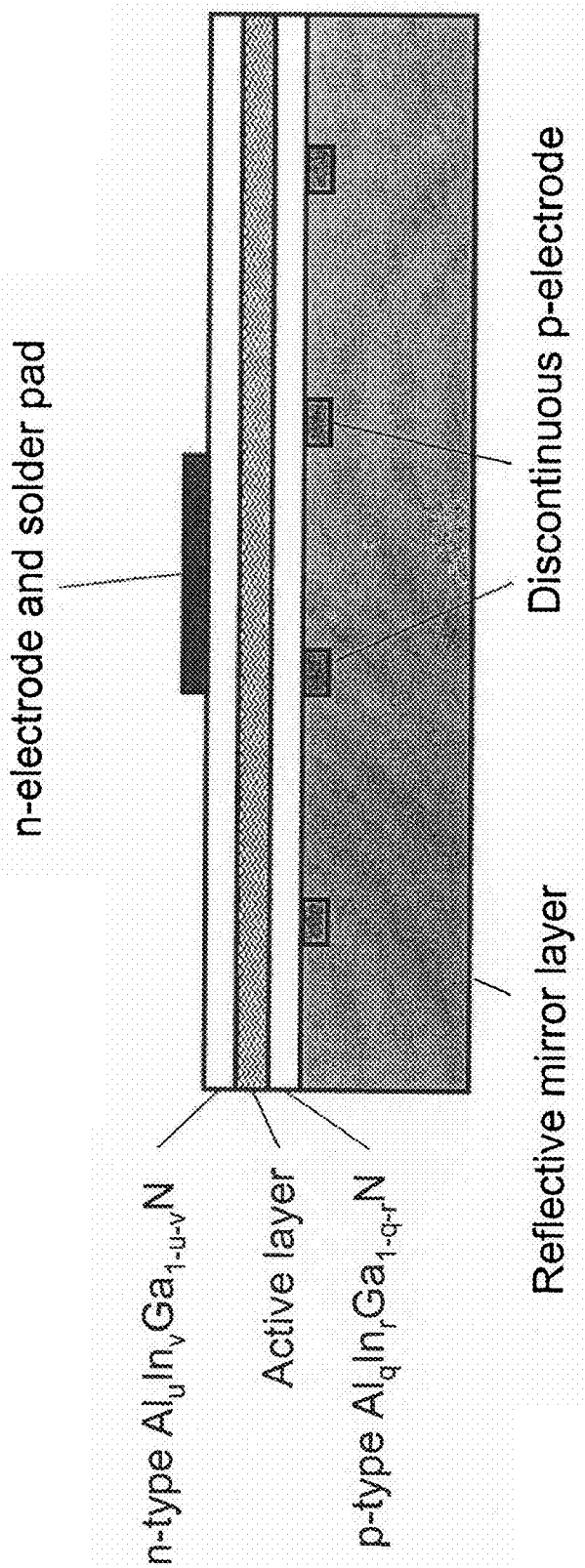
Fig. 6: Backside n-contact

MICROCAVITY LIGHT EMITTING DIODE METHOD OF MANUFACTURE

CROSS-REFERENCES TO RELATED APPLICATIONS

This application claims priority to U.S. Provisional Patent Application No. 61/102,345 filed Oct. 2, 2008, commonly assigned, and of which is incorporated by reference in its entirety herein.

STATEMENT AS TO RIGHTS TO INVENTIONS MADE UNDER FEDERALLY SPONSORED RESEARCH OR DEVELOPMENT

Reference to a "Sequence Listing," a Table, or a Computer Program Listing Appendix Submitted on a Compact Disk

Background of the Invention

The present invention relates generally to optical techniques. More specifically, embodiments of the invention include techniques for fabricating a light emitting diode device using bulk gallium nitride containing materials. Merely by way of example, the invention can be applied to applications such as optoelectronic devices, and the like.

Much progress has been made during the past decade and a half in the performance of gallium nitride (GaN) based light emitting diodes (LEDs). Devices with a luminous efficiency higher than 100 lumens per watt have been demonstrated in the laboratory, and commercial devices have an efficiency that is already considerably superior to that of incandescent lamps and competitive with that of fluorescent lamps. Further improvements in efficiency are desired in order to reduce operating costs, reduce electricity consumption, and decrease emissions of carbon dioxide and other greenhouse gases produced in generating the energy used for lighting applications.

The efficiency of LEDs is limited in part by the internal quantum efficiency and by the light extraction efficiency. The internal quantum efficiency can be improved by the use of bulk gallium nitride substrates, with low concentrations of threading dislocations, and by the use of nonpolar and semipolar crystallographic orientations, which reduce or eliminate the presence of deleterious polarization electric fields within the device.

The light extraction efficiency can be improved by the use of cavity configurations. For example, U.S. Pat. No. 7,009,215, hereby incorporated by reference in its entirety, discusses use of resonant cavity configurations in conjunction with low-defect-density single crystal gallium nitride substrates of various crystallographic orientations. However, the configurations include the bulk substrate within the cavity, making device performance very sensitive to optical absorption within the substrate, and involve fabrication of distributed Bragg reflectors (DBRs), which may be expensive.

Several authors have disclosed the fabrication of microcavity LEDs, which can deliver enhanced light extraction without the complexity of DBRs [see, for example, C. Weisbuch et al., "Recent results and latest views on microcavity LEDs," in Light-Emitting Diodes: Research, Manufacturing, and Applications VIII, ed. By S. A. Stockman et al., Proc. SPIE Vol. 5366, p. 1 (2004)]. In a recent study, Choi et al. [Applied Physics Letters 91, 061120 (2007)] fabricated and characterized an InGaN-based LED which had an optical thickness of 2.5 wavelengths at the peak emission wavelength of 415 nanometers. These authors performed flip chip bonding and laser liftoff to remove the sapphire substrate, used an AlGaN etch stop to help with fabrication of the extremely thin (less than one micron total) semiconductor layers, and successfully demonstrated microcavity effects and improved light extraction. Pattison et al. [Applied Physics Letters 90, 031111 (2007)] demonstrated both resonant and detuned emission in microcavity LEDs with an optical thickness of approximately 2 wavelengths at a peak emission wavelength of 455 nm. However, this technical approach is technically difficult, is generally limited to the preparation of c-plane, polar GaN-based devices, is limited to the case where the bandgap of the substrate material is larger than that of the semiconductor material, and is not generally capable of fabricating devices with very low dislocation densities, which may limit the internal quantum efficiency and hence the overall performance.

U.S. Pat. No. 7,053,413, hereby incorporated by reference in its entirety, discusses fabrication of a homoepitaxial LED on a bulk GaN substrate with a dislocation density below $10^4$ $cm^{-2}$, followed by removal of a portion of the substrate. However, the only means taught for removal of the portion of the substrate are lapping, polishing, chemical etching, plasma etching, and ion beam etching. These methods do not provide a natural endpoint, and it is therefore extremely difficult to remove all but a few- or sub-micron-thick layer of uniform thickness, and are slow and expensive to perform.

What is needed is a manufacturable technique for fabricating an LED with improved light extraction capability and, simultaneously, an ultralow defect density and high crystallographic quality device structure with a high internal quantum efficiency.

BRIEF SUMMARY OF THE INVENTION

According to the present invention, optical techniques are provided. More specifically, embodiments of the invention include techniques for fabricating a light emitting diode device using bulk gallium nitride containing materials. Merely by way of example, the invention can be applied to applications such as optoelectronic devices, and the like.

In a specific embodiment, the present invention provides a microcavity light emitting diode. The device includes a semiconductor active layer comprising a gallium species and a nitrogen species. The semiconductor active layer is characterized by a peak emission wavelength and has an active layer surface dislocation density below about $10^5$ $cm^{-2}$. In a specific embodiment, the device also has at least one semiconductor n-type layer has an n-type layer surface dislocation density below about $10^5$ $cm^{-2}$. The device has at least one semiconductor p-type layer comprising a gallium species and a nitrogen species and an electrical contact coupled to at least one semiconductor n-type layer. The device also has a reflective electrical contact coupled to at least one of a semiconductor p-type layer and a semiconductor n-type layer. The reflective electrical contact has a reflectivity greater than about 70% at the peak emission wavelength. The device has a total thickness characterizing the semiconductor active layer, n-type layer, and the p-type layer of less than $6\lambda/n$. The device has a uniformity to within approximately $\pm\lambda/(4n)$ and n is a thickness averaged index of refraction at the peak emission wavelength characterizing the total thickness of the semiconductor active layer, n-type layer, and the p-type layer.

In an alternative specific embodiment, the present invention provides a method of making a microcavity light emitting diode. The method includes providing a high quality nitride crystal comprising a base nitride crystal and a release layer. Preferably, the high quality nitride crystal comprises a gallium species and a nitrogen species and having a surface dislocation density below $10^5$ cm$^{-2}$. The method also includes forming an n-type semiconductor layer overlying the release layer, the n-type semiconductor layer comprising a gallium species and a nitrogen species, a semiconductor active layer comprising a gallium species and a nitrogen species characterized by a peak light emission wavelength, and a p-type semiconductor layer comprising a gallium species and a nitrogen species to form a sandwich structure including the n-type semiconductor layer, the semiconductor active layer, and the p-type semiconductor layer. The method forms a reflective contact overlying the p-type semiconductor layer and removes the base nitride crystal from the sandwich structure, which is maintained intact. In a preferred embodiment, the sandwich structure has a total thickness of less than about $6\lambda/n$, where $\lambda$ is the peak emission wavelength, and n is a thickness averaged index of refraction at the peak emission wavelength.

Still further, a method of making a microcavity light emitting diode includes providing a high quality nitride crystal comprising a base nitride crystal and a release layer, comprising a gallium species and a nitrogen species and having a surface dislocation density below $10^5$ cm$^{-2}$. The method also includes forming an n-type semiconductor layer overlying the release layer, the n-type semiconductor layer comprising a gallium species and a nitrogen species, a semiconductor active layer comprising a gallium species and a nitrogen species characterized by a peak light emission wavelength, and a p-type semiconductor layer comprising a gallium species and a nitrogen species to form a sandwich structure of formed semiconductor layer. In a specific embodiment, the sandwich structure of formed semiconductor layers has a total thickness of less than about $6\lambda/n$, where $\lambda$ is the peak emission wavelength, and n is a thickness averaged index of refraction at the peak emission wavelength. The method also includes joining the sandwich structure to a handle substrate and removing the base nitride crystal from the sandwich structure, which are maintained intact, while maintaining the handle substrate to the sandwich structure to expose the n-type semiconductor layer. The method includes forming a reflective contact overlying the exposed n-type semiconductor layer.

As used herein, the term "microcavity" generally means only one mode couples to air or the order of the cavity is less than $2n^2$, where n is the refractive index at the wavelength of interest, but should generally be interpreted by ordinary meaning.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 1 through 4 are simplified diagrams of optical devices according to various embodiments of the present invention.

FIG. 5 is a simplified diagram illustrating a method for fabricating an optical device according to an embodiment of the present invention; and FIG. 6 is a simplified diagram of an optical device according to an alternative embodiment of the present invention.

DETAILED DESCRIPTION OF THE INVENTION

According to the present invention, optical techniques are provided. More specifically, embodiments of the invention include techniques for fabricating a light emitting diode device using bulk gallium nitride containing materials. Merely by way of example, the invention can be applied to applications such as optoelectronic devices, and the like.

Referring to FIG. 1, the starting point for the present invention is a substrate consisting essentially of a high quality nitride crystal with a release layer, as disclosed in U.S. Application Publication No. 2010/0219505, entitled, "Nitride crystal with release layer, method of making, and method of use," which is hereby incorporated by reference in its entirety. The nitride crystal comprises nitrogen and has a surface dislocation density below $10^5$ cm$^{-2}$. The nitride crystal or wafer may comprise $Al_xIn_yGa_{1-x-y}N$, where $0 \leq x, y, x+y \leq 1$. In one specific embodiment, the nitride crystal comprises GaN. The nitride crystal has a release layer with an optical absorption coefficient greater than 1000 cm$^{-1}$ at least one wavelength where the base crystal underlying the release layer is substantially transparent, with an optical absorption coefficient less than 50 cm$^{-1}$, and may further comprise a high quality epitaxial layer, which also has a surface dislocation density below $10^5$ cm$^{-2}$. The release layer may be etched under conditions where the nitride base crystal and the high quality epitaxial layer are not.

In one set of embodiments, the high quality nitride crystal has threading dislocations, at a concentration between about $10^5$ cm$^{-2}$ and about $10^8$ cm$^{-2}$, in a direction that is substantially orthogonal or oblique with respect to the surface. As a consequence of the orthogonal or oblique orientation of the dislocations, the surface dislocation density is below about $10^5$ cm$^{-2}$.

The substrate may have a large-surface orientation within ten degrees, within five degrees, within two degrees, within one degree, within 0.5 degree, or within 0.2 degree of (0 0 0 1), (0 0 0 -1), {1 -1 0 0}, {1 1 -2 0}, {1 -1 0 ±1}, {1 -1 0 ±2}, {1 -1 0 ±3}, {2 0 -2 ±1} or {1 1 -2 ±2}. In one specific embodiment, the substrate has a semipolar large-surface orientation, which may be designated by (hkil) Bravais-Miller indices, where i=-(h+k), l is nonzero and at least one of h and k are nonzero. The substrate may have a surface dislocation density below $10^4$ cm$^{-2}$, below $10^3$ cm$^{-2}$, or below $10^2$ cm$^{-2}$. The nitride base crystal or wafer may have an optical absorption coefficient below 100 cm$^{-1}$, below 50 cm$^{-1}$ or below 5 cm$^{-1}$ at wavelengths between about 465 nm and about 700 nm. The nitride base crystal may have an optical absorption coefficient below 100 cm$^{-1}$, below 50 cm$^{-1}$ or below 5 cm$^{-1}$ at wavelengths between about 700 nm and about 3077 nm and at wavelengths between about 3333 nm and about 6667 nm.

In a preferred embodiment, the release layer comprises heavily cobalt-doped GaN, has a high crystal quality, and is substantially black, with an optical absorption coefficient greater than 1000 cm$^{-1}$ or greater than 5000 cm$^{-1}$ across the visible spectrum, including the range between about 465 nm and about 700 nm. The release layer is between about 0.05 micron and about 50 microns thick and has a temperature stability approximately the same as the underlying base crystal and exhibits minimal strain with respect to the underlying base crystal.

The nitride crystal may further comprise a high quality epitaxial layer on top of the release layer. In some embodiments the high quality layer is doped, for example, with Si or O to form n-type material, with a dopant concentration between about $10^{16}$ cm$^{-3}$ and $10^{20}$ cm$^{-3}$.

If it is not already present in the surface region of the substrate, an n-type $Al_uIn_vGa_{1-u-v}N$ layer, where $0 \leq u, v, u+v \leq 1$, is deposited on the substrate. The carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

For example, the substrate is placed on a susceptor in an MOCVD reactor. After closing, evacuating, and back-filling the reactor to atmospheric pressure, the susceptor is heated to a temperature between about 1000 and about 1200 degrees Celsius in the presence of a nitrogen-containing gas. In one specific embodiment, the susceptor is heated to approximately 1185 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 and 10 sccm, is initiated.

In some embodiments, an AlGaN layer is incorporated into the structure as an etch-stop layer. The etch-stop layer may be 25-100 nm thick and may have an Al/Ga ratio between about 0.05 and 0.5, and may be deposited below or within the n-type $Al_uIn_vGa_{1-u-v}N$ layer.

Following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w, x, y, z, w+x, y+z \leq 1$, where $w<u$, y and/or $x>v$, z so that the bandgap of the well layer(s) is less than that of the barrier layer(s) and of the n-type layer. The well layers and barrier layers may each have a thickness between about 1 nm and about 20 nm. In another embodiment, the active layer comprises a double heterostructure, with an InGaN or $Al_wIn_xGa_{1-w-x}N$ layer about 20 nm to about 500 nm thick surrounded by GaN or $Al_yIn_zGa_{1-y-z}N$ layers, where $w<u$, y and/or $x>v$, z. The composition and structure of the active layer are chosen to provide light emission at a preselected wavelength. The active layer may be left undoped (or unintentionally doped) or may be doped n-type or p-type.

In some embodiments, an electron blocking layer is deposited next. The electron-blocking layer may comprise $Al_sIn_tGa_{1-s-t}N$, where $0 \leq s, t, s+t \leq 1$, with a higher bandgap than the active layer, and may be doped p-type. In one specific embodiment, the electron blocking layer comprises AlGaN. In another embodiment, the electron blocking layer comprises an AlGaN/GaN multiquantum barrier (MQB), comprising alternating layers of AlGaN and GaN, each with a thickness between about 0.2 nm and about 5 nm.

Next, a p-type doped $Al_qIn_rGa_{1-q-r}N$, where $0 \leq q, r, q+r \leq 1$, layer is deposited above the active layer. The p-type layer may be doped with Mg, to a level between about $10^{16}$ cm$^{-3}$ and $10^{21}$ cm$^{-3}$, and may have a thickness between about 5 nm and about 500 nm. The outermost 1-30 nm of the p-type layer may be doped more heavily than the rest of the layer, so as to enable an improved electrical contact.

In a specific embodiment, a tunnel junction and another n-type layer are deposited on top of the p-type layer.

The semiconductor layers have the same crystallographic orientation, to within about two degrees, as the substrate, have a very high crystalline quality, comprise nitrogen, and have a surface dislocation density below $10^5$ cm$^{-2}$. The semiconductor layers may have a surface dislocation density below $10^4$ cm$^{-2}$, below $10^3$ cm$^{-2}$, or below $10^2$ cm$^{-2}$. In some embodiments, the semiconductor layers are substantially transparent, with an optical absorption coefficient below 100 cm$^{-1}$, below 50 cm$^{-1}$ or below 5 cm$^{-1}$ at wavelengths between about 700 nm and about 3077 nm and at wavelengths between about 3333 nm and about 6667 nm.

In a specific embodiment, the semiconductor layers have an orientation within five degrees of m-plane and the FWHM of the 1-100 x-ray rocking curve of the top surface is below 300 arc sec, below 100 arc sec, or below 50 arc sec. In another specific embodiment, the semiconductor layers have an orientation within five degrees of a-plane and the FWHM of the 11-20 x-ray rocking curve of the top surface is below 300 arc sec, below 100 arc sec, or below 50 arc sec. In yet another specific embodiment, the semiconductor layers have an orientation within five degrees of a semi-polar orientation selected from {1 –1 0 ±1}, {1 –1 0 ±2}, {1 –1 0 ±3}, {2 0 –2 ±1}, or {1 1 –2 ±2} and the FWHM of the lowest-order semipolar symmetric x-ray rocking curve of the top surface is below 300 arc sec, below 100 arc sec, or below 50 arc sec. In another specific embodiment, the semiconductor layers have an orientation within five degrees of (0001) c-plane and the FWHM of the 0002 x-ray rocking curve of the top surface is below 300 arc sec, below 100 arc sec, or below 50 arc sec. In still another specific embodiment, the semiconductor layers have an orientation within five degrees of (000-1) c-plane and the FWHM of the 000-2 x-ray rocking curve of the top surface is below 300 arc sec, below 100 arc sec, or below 50 arc sec.

In a set of embodiments, the total thickness of the semiconductor layers, as measured between the removal layer and the outermost surface of the p-type layer or of the tunnel junction plus second n-type layer, if the latter are present, is uniform to within approximately $\pm \lambda/(4n)$ and is less than about $6\lambda/n$, where $\lambda$ is the peak emission wavelength, and n is the thickness-averaged index of refraction at the peak emission wavelength characterizing the total thickness of the semiconductor active layer, n-type layer, and the p-type layer. Depending on the peak emission wavelength and the composition of the semiconductor layers, the thickness-averaged index of refraction may be between about 2.2 and about 2.8. In a preferred embodiment, the total thickness of the semiconductor layers is uniform to within approximately $\pm \lambda/(8n)$. Achieving this degree of uniformity with a low-defect substrate is not possible with approaches based on prior art. In the present invention, the uniformity in the overall thickness of the semiconductor layers is defined by the uniformity in deposition of the layers, as opposed to uniformity in lapping or polishing removal of the substrate. A thickness uniformity of 5%, 2%, 1%, or less, can be achieved across a 50 mm substrate by methods that are known in the art. For a microcavity LED with an overall device thickness of $2.5\lambda/n$, a uniformity of $\pm \lambda/(8n)$ corresponds in relative terms to about a 5% thickness uniformity, readily achievable.

The microcavity may be defined to be resonant or detuned, for improved light extraction or to achieve a predetermined angular distribution of emitted light. In some embodiments, the total thickness of the semiconductor layers is uniformly within $\pm \lambda/(4n)$ of $j\lambda/(2n)$, where j is an integer. In some embodiments, the total thickness of the semiconductor layers is uniformly within $\pm \lambda/(8n)$ of $j\lambda/(2n)$. In other embodiments, the total thickness of the semiconductor layers is uniformly within $\pm \lambda/(4n)$ or within $\pm \lambda/(8n)$ of $(j+\frac{1}{2})\lambda/n$.

In a preferred embodiment, the active layer is centered at a distance within $\pm \lambda/(8n)$ of $(2i+1)\lambda/(4n)$, where i is an integer, from the reflective electrical contact, which is typically approximately coincident with the outermost surface of the p-type layer or of the tunnel junction plus second n-type layer, if the latter are present. In a preferred embodiment, the active layer has an overall thickness less than $\lambda/(4n)$, so that most of the active layer is located within an anti-node region of the standing wave. Without wishing to be bound by theory, the inventors believe that this structure provides relatively efficient light extraction by fitting a half-integer number of wavelengths within the device structure in a direction perpendicular to the surface, with a node of the fundamental optical mode at the outermost surface of the p-type layer, an anti-node at the emission surface (e.g., the boundary between the n-type layer and the release layer), and an anti-node at the active layer.

A reflective electrical contact, with a reflectivity greater than about 70%, is then deposited on the p-type semiconductor layer or on the second n-type layer above a tunnel junction, if it is present. In another embodiment, the reflective electrical contact is placed on the n-type side of the device structure. In a preferred embodiment, the reflectivity of the reflective electrical contact is greater than 80% or greater than 90%. The reflective electrical contact may comprise at least one of silver, gold, aluminum, nickel, platinum, rhodium, palladium, chromium, or the like. The reflective electrical contact may be deposited by thermal evaporation, electron beam evaporation, sputtering, or another suitable technique. In a preferred embodiment, the reflective electrical contact serves as the p-type electrode for the microcavity LED. In another embodiment, the reflective electrical contact serves as an n-type electrode for the microcavity LED.

In some embodiments, as shown in FIG. 2, the reflective metallic electrical contact comprises a two-component mirror/p-electrode including a discontinuous p-electrode and a reflective mirror layer. The discontinuous p-electrode is optimized as an electrical contact and can be made, for example, of a nickel/gold or a platinum/gold stack where the nickel or platinum is about 20 to 200 nm thick and the gold is about 100 nm to 1 micron thick. In one suitable embodiment, the discontinuous p-electrode is a gridded electrode having grid openings of between about 1 micron and 0.1 cm on a side. The reflective mirror layer may comprise at least one of silver, gold, aluminum, platinum, rhodium, palladium, chromium, or the like, and is deposited over the p-type layer and over the gridded p-electrode. Preferably, the mirror layer is deposited after any annealing processing of the discontinuous p-electrode to reduce interdiffusion. Optionally, a diffusion barrier layer such as nickel, rhodium, platinum, palladium, iridium, ruthenium, rhenium, tungsten, molybdenum, niobium, tantalum, or $MC_xN_yO_z$ (where M includes a metallic element such as aluminum, boron, silicon, titanium, vanadium, chromium, yttrium, zirconium, lanthanum, or a rare earth metal, and x, y, z are each between 0 and 3) is disposed between the discontinuous p-electrode and the mirror layer. Rather than a grid configuration, the discontinuous p-electrode can be arranged as an array of dots, rectangles, circles, or the like. The separation between the p-electrode array elements is preferably between about 1 micron and 0.1 cm. The use of a reflective metal p-electrode or combination of reflective mirror layer and discontinuous electrode enables fabrication of large area microcavity light emitting diodes without necessitating lateral carrier transport through p-doped layers over large distances.

In another set of embodiments, as illustrated in FIG. 3, the reflective metallic electrical contact further comprises a semitransparent current-spreading layer. The current-spreading layer may comprise at least one of nickel oxide (NiO), nickel oxide/gold (NiO/Au), NiO/Ag, indium tin oxide (ITO), p-type zinc oxide (ZnO), ruthenium oxide ($RuO_2$), or the like. The current-spreading layer facilitates electrical contact to the p-type GaN layer 24, for example, ohmic or quasi-ohmic behavior. To minimize light absorption in the semi-transparent current-spreading layer 40, this layer has a thickness which is preferably between about 1 nm and about 10 nm, with more than 70% light transmission. The reflective metallic electrical contact may further comprise a transparent dielectric disposed on a portion of the semitransparent current-spreading layer. The transparent dielectric may comprise at least one of $TiO_2$, $Ta_2O_5$, $ZrO_2$, $SiO_2$, $SiO_x$, $SiN_x$, $Si_3N_4$, or $SiO_xN_y$. The transparent dielectric may be a quarter-wave thick, that is, have a thickness approximately equal to one-quarter of the peak emission wavelength divided by the refractive index. The transparent dielectric includes open areas in which an electrical contact material is disposed. The electrical contact material may comprise at least one of nickel (Ni), nickel oxide (NiO), titanium-tungsten/gold (Ti—W/Au). In a preferred embodiment, the electrical contact material does not extend over the transparent dielectric. A reflective mirror layer is disposed over the transparent dielectric and the electrical contact material and electrically interconnects the electrical contact material in the various grid openings. The reflective mirror layer also cooperates with the transparent dielectric to define a reflector for reflecting light generated in the active layer. Further variations of the reflective metallic contact are described in U.S. Pat. No. 7,119,372, which is hereby incorporated by reference in its entirety.

In some embodiments, n-type contacts are placed on the same side of the device as the p-type contacts, as shown in FIG. 4. Vias are etched through the reflective metallic electrical contact, the p-type layer and the active layer, to expose portions of the n-type layer. The walls of the vias are coated with a via insulating layer comprising a dielectric, such as at least one of $SiO_2$, $SiO_x$, $SiN_x$, $Si_3N_4$, or $SiO_xN_y$. The inner portions of the via insulating layer are then coated with a suitable metal to form a discontinuous n-type electrode. The composition of the n-type electrode may comprise at least one of Ti, Al, and Au, or a stack thereof.

The wafer, comprising the microcavity LED structure, may be separated into one or more discrete dies, as shown in FIG. 5. For example, the backside of the wafer may be mechanically or laser scribed and then cleaved to form one or more discrete dies. At least one die may be flip-chip bonded to a submount or to a metal substrate. The submount may comprise silicon, aluminum nitride, aluminum oxide, another ceramic, or the like. In some embodiments, the p-type electrical contact is attached to interconnect metallization on the submount or to the metal substrate by means of a solder joint. The solder joint may comprise at least one of In, PbSn, and AuSn. The solder joint may be formed by gold plating the back of the reflective metallic electrical contact, evaporating Sn onto the gold layer, flipping the die and placing it in contact with a Au-coated submount, and heating to a temperature of about 280 degrees Celsius. The die may be additionally bonded to the submount or metal substrate by at least one of epoxy and wax.

The semiconductor structure, comprising the n-type layer, the active layer, the p-type layer, and the reflective metallic contact, may be separated from the nitride base crystal, or at least from the portion of the nitride base crystal still attached to the die. The removal may be effected by laser liftoff. The release layer may be illuminated by laser radiation at a wavelength at which it has an optical absorption coefficient greater than 1000 $cm^{-1}$ and the base crystal is substantially transparent, with an optical absorption coefficient less than 50 $cm^{-1}$. In one set of embodiments, the removal layer is illuminated by laser radiation through the nitride base crystal. Separation may be performed at a temperature above the melting point of the metal produced by decomposition, e.g., above about 30 degrees Celsius in the case of gallium metal.

After separation of the high quality epitaxial layer from the nitride base crystal, any residual gallium, indium, or other metal or nitride on the newly exposed back surface of the high quality epitaxial layer may be removed physically or by treatment with at least one of hydrogen peroxide, an alkali hydroxide, tetramethylammonium hydroxide, an ammonium salt of a rare-earth nitrate, perchloric acid, sulfuric acid, nitric acid, acetic acid, hydrochloric acid, and hydrofluoric acid. The back side of the high quality epitaxial layer may be cleaned or damage removed by dry-etching in at least one of Ar, $Cl_2$, and $BCl_3$, by techniques such as chemically-assisted ion beam etching (CAIBE), inductively-coupled plasma (ICP) etching, or reactive ion etching (RIE). The back side of the high quality epitaxial layer may be treated by chemical mechanical polishing.

In some embodiments, traces of the release layer may remain after laser liftoff or etching from the edges of the release layer. Residual release layer material may be removed by chemical etching or by photoelectrochemical etching, illuminating the back side of the high quality epitaxial layer with radiation at a wavelength at which the release layer has an optical absorption coefficient greater than 1000 $cm^{-1}$ and the high quality epitaxial layer is substantially transparent, with an optical absorption coefficient less than 50 $cm^{-1}$.

In some embodiments, an n-type contact is deposited on the freshly-exposed backside of the n-type layer, as shown in FIG. 6. The composition of the n-type electrode may comprise at least one of Ti, Al, and Au, or a stack thereof. The n-contact may comprise a solder pad and may further comprise a current-spreading pattern, such as lines emanating from the solder pad, a grid pattern, a transparent conductive oxide such as indium tin oxide, or the like.

In an alternative embodiments, the reflective contact is formed overlying the n-type semiconductor layer rather than the p-type semiconductor layer. After forming a sandwich structure comprising an n-type semiconductor layer overlying the release layer, a semiconductor active layer, and a p-type semiconductor layer, the sandwich structure is joined to a handle substrate. The joining may comprise bonding, such as wafer bonding. The handle substrate may comprise a wafer of silicon, gallium arsenide, sapphire, gallium phosphide, indium phosphide, zinc oxide, gallium nitride, aluminum nitride, silicon dioxide, a-quartz, amorphous silica, or CVD diamond. The handle substrate may be single crystal, polycrystalline, or amorphous. The base nitride crystal may then be removed from the sandwich structure by laser liftoff, while maintaining the sandwich structure intact and the handle substrate joined to the sandwich structure, in order to expose the n-type semiconductor layer. A reflective contact overlying the exposed n-type semiconductor layer may then be formed. The reflective contact may be a simple metallic coating, or may comprise a discontinuous n-type electrode overlain by a reflective contact, by analogy to the reflective p-type electrode described above. In some embodiments, the handle substrate is then removed, releasing the sandwich structure having the overlying reflective contact. Removal of the handle substrate may be performed by chemical dissolution of the like.

Other methods besides laser liftoff may be employed to effect separation of the semiconductor layers from the nitride base crystal. For example, CrN may be employed as a release layer and may be removed by wet etching after flip chip bonding of the device structures to a submount.

The light extraction efficiency of the microcavity light emitting diode may be greater than 50%. In a preferred embodiment, the light extraction efficiency of the microcavity light emitting diode is greater than 75%. The light extraction efficiency may be defined as the external quantum efficiency divided by the internal quantum efficiency. The external quantum efficiency may be measured by methods that are well known in the art. Rigorous determination of the internal quantum efficiency may be more difficult. However, the internal quantum efficiency may be measured with sufficient accuracy as the ratio of the external quantum efficiency at room temperature to the external quantum efficiency at low temperature, for example, below 10 degrees Kelvin. In some embodiments, the microcavity light emitting diode is run at a drive current of greater than about 100 milliamperes per square millimeter. In one specific embodiment, the microcavity light emitting diode is run at a drive current of greater than about 350 milliamperes per square millimeter.

In some embodiments, at least one microcavity light emitting diode is packaged along with at least one phosphor, as described in U.S. patent application 61/086,139, entitled "White light devices using non-polar or semipolar gallium containing materials and phosphors," which is hereby incorporated by reference in its entirety. In other embodiments, at least one microcavity light emitting diode is co-packaged along with at least one additional light emitting diode, as described in U.S. Application Publication No. 2010/0025656, entitled "Copackaging configurations for nonpolar GaN and/or semipolar GaN LEDs," which is hereby incorporated by reference in its entirety.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A microcavity light emitting diode, comprising:
  a semiconductor active layer comprising $Al_wIn_xGa_{1-w-x}N$, where $0 \leq w, x, w+x \leq 1$, the semiconductor active layer being characterized by a peak emission wavelength ($\lambda$) and having an active layer surface dislocation density below about $10^5$ $cm^{-2}$;
  at least one semiconductor n-type layer comprising $Al_uIn_vGa_{1-u-v}N$, where $0 \leq u, v, u+v \leq 1$, the at least one semiconductor n-type layer having an n-type layer surface dislocation density below about $10^5$ $cm^{-2}$;
  at least one semiconductor p-type layer comprising $Al_qIn_rGa_{1-q-r}N$, where $0 \leq q, r, q+r \leq 1$;
  an electrical contact coupled to the at least one semiconductor n-type layer;
  a reflective electrical contact coupled to the at least one semiconductor p-type layer and the at least one semiconductor n-type layer, the reflective electrical contact having a reflectivity greater than about 70% at the peak emission wavelength;
  a total thickness characterizing the semiconductor active layer, the at least one semiconductor n-type layer, and the at least one semiconductor p-type layer of less than $6\lambda/n$; and
  a uniformity to within approximately $\pm\lambda/(4n)$ wherein n is a thickness averaged index of refraction at the peak emission wavelength characterizing the total thickness of the semiconductor active layer, the at least one semiconductor n-type layer, and the at least one semiconductor p-type layer.

2. The microcavity light emitting diode of claim 1, wherein the total thickness is less than $3\lambda/n$.

3. The microcavity light emitting diode of claim 1, wherein the at least one semiconductor p-type layer has a p-type layer surface dislocation density below about $10^5$ $cm^{-2}$.

4. The microcavity light emitting diode of claim 1, wherein each of the active layer surface dislocation density, the n-type layer surface dislocation density, and a p-type layer surface dislocation density of the at least one semiconductor p-type layer are below $10^4$ cm$^{-2}$.

5. The microcavity light emitting diode of claim 4, wherein each of the active layer surface dislocation density, the n-type layer surface dislocation density, and the p-type layer surface dislocation density are below $10^3$ cm$^{-2}$.

6. The microcavity light emitting diode of claim 5, wherein each of the active layer surface dislocation density, the n-type layer surface dislocation density, and the p-type layer surface dislocation density are below $10^2$ cm$^{-2}$.

7. The microcavity light emitting diode of claim 1, wherein the semiconductor active layer is centered at a distance within $\pm\lambda/(8n)$ of $(2i+1)\lambda/(4n)$, where i is an integer, from the reflective electrical contact.

8. The microcavity light emitting diode of claim 1, wherein the semiconductor active layer has an overall thickness of less than $\lambda/(4n)$.

9. The microcavity light emitting diode of claim 1, wherein the total thickness is uniformly within $\pm\lambda/(4n)$ of $j\lambda/(2n)$, where j is an integer.

10. The microcavity light emitting diode of claim 1, wherein the total thickness is uniform to within $\pm\lambda/(8n)$.

11. The microcavity light emitting diode of claim 1, wherein the reflectivity of the reflective electrical contact is greater than about 90%.

12. The microcavity light emitting diode of claim 1, wherein the semiconductor active layer has an active layer surface orientation within 5 degrees of {1 –1 0 0}, the at least one semiconductor n-type layer has an n-type surface orientation within 5 degrees of {1 –1 0 0}, and the at least one semiconductor p-type layer has a p-type surface orientation within 5 degrees of {1 –1 0 0}.

13. The microcavity light emitting diode of claim 1, the semiconductor active layer has an active layer surface orientation within 5 degrees of {1 1 –2 0}, the at least one semiconductor n-type layer has an n-type surface orientation within 5 degrees of {1 1 –2 0}, and the at least one semiconductor p-type layer has a p-type surface orientation within 5 degrees of {1 1 –2 0}.

14. The microcavity light emitting diode of claim 1, the semiconductor active layer has an active layer surface orientation within 5 degrees of {1 –1 0 ±1}, the at least one semiconductor n-type layer has an n-type surface orientation within 5 degrees of {1 –1 0 ±1}, and the at least one semiconductor p-type layer has a p-type surface orientation within 5 degrees of {1 –1 0 ±1}.

15. The microcavity light emitting diode of claim 1, the semiconductor active layer has an active layer surface orientation within 5 degrees of {1 –1 0 ±2}, the at least one semiconductor n-type layer has an n-type surface orientation within 5 degrees of {1 –1 0 ±2}, and the at least one semiconductor p-type layer has a p-type surface orientation within 5 degrees of {1 –1 0 ±2}.

16. The microcavity light emitting diode of claim 1, the semiconductor active layer has an active layer surface orientation within 5 degrees of {1 –1 0 ±3}, the at least one semiconductor n-type layer has an n-type surface orientation within 5 degrees of {1 –1 0 ±3}, and the at least one semiconductor p-type layer has a p-type surface orientation within 5 degrees of {1 –1 0 ±3}.

17. The microcavity light emitting diode of claim 1, the semiconductor active layer has an active layer surface orientation within 5 degrees of {1 1 –2 ±2}, the at least one semiconductor n-type layer has an n-type surface orientation within 5 degrees of {1 1 –2 ±2}, and the at least one semiconductor p-type layer has a p-type surface orientation within 5 degrees of {1 1 –2 ±2}.

18. The microcavity light emitting diode of claim 1, the semiconductor active layer has an active layer surface orientation within 5 degrees of {2 0 –2 ±1}, the at least one semiconductor n-type layer has an n-type surface orientation within 5 degrees of {2 0 –2 ±1}, and the at least one semiconductor p-type layer has a p-type surface orientation within 5 degrees of {2 0 –2 ±1}.

19. The microcavity light emitting diode of claim 1, the semiconductor active layer has an active layer surface orientation within 5 degrees of (0 0 0 1), the at least one semiconductor n-type layer has an n-type surface orientation within 5 degrees of (0 0 0 1), and the at least one semiconductor p-type layer has a p-type surface orientation within 5 degrees of (0 0 0 1).

20. The microcavity light emitting diode of claim 1, the semiconductor active layer has an active layer surface orientation within 5 degrees of (0 0 0 –1), the at least one semiconductor n-type layer has an n-type surface orientation within 5 degrees of (0 0 0 –1), and the at least one semiconductor p-type layer has a p-type surface orientation within 5 degrees of (0 0 0 –1).

21. The microcavity light emitting diode of claim 1, further comprising a tunnel junction.

22. The microcavity light emitting diode of claim 1, wherein the at least one semiconductor p-type layer and the reflective electrical contact are substantially parallel in configuration.

23. The microcavity light emitting diode of claim 1, wherein the at least one semiconductor p-type layer, the reflective electrical contact, and the one semiconductor n-type layer are in parallel configuration.

24. The microcavity light emitting diode of claim 1 further comprising a light extraction efficiency of greater than about 50%.

25. The microcavity light emitting diode of claim 1 further comprising a drive current of greater than about 100 milliamperes per square millimeter.

26. The microcavity light emitting diode of claim 1 wherein the thickness averaged index of refraction (n) is between about 2.2 and about 2.8.

\* \* \* \* \*